United States Patent [19]

Hall

[11] Patent Number: 4,892,343

[45] Date of Patent: Jan. 9, 1990

[54] VACUUM PENCIL

[76] Inventor: Brian E. Hall, 3046 E. Dover St., Mesa, Ariz. 85213

[21] Appl. No.: 253,689

[22] Filed: Oct. 5, 1988

[51] Int. Cl.[4] .......................... B66C 1/02; B25J 15/06
[52] U.S. Cl. ................................................. 294/64.1
[58] Field of Search ........................ 294/64.1; 29/743; 269/21

[56] References Cited

U.S. PATENT DOCUMENTS

| | | | |
|---|---|---|---|
| 2,127,154 | 7/1936 | Burk | 294/64.1 |
| 2,341,621 | 2/1944 | Johnson | 294/64.1 |
| 4,620,738 | 11/1986 | Schwartz et al. | 294/64.1 |

FOREIGN PATENT DOCUMENTS 1051198  2/1959  Fed. Rep. of Germany .

Primary Examiner—Johnny D. Cherry
Assistant Examiner—V. Nishanian
Attorney, Agent, or Firm—Cahill, Sutton & Thomas

[57] ABSTRACT

A vacuum pencil for transporting semiconductor wafers includes a relatively flat, planar frame member having an enlarged end with a circular hole formed therein. A handle is coupled to the other end of the flat frame member. A relatively flat, deformable elastic member is positioned adjacent and below the enlarged end of the flat frame member and concentric with the hole formed therein. A lever member has a relatively flat first end lying closely adjacent to the flat frame member. The flat first end of the lever member is connected to the center of the deformable elastic member, and an opposing second end of the flat frame member is adapted to be depressed by the user, thereby causing the flat first end to raise the center of the deformable elastic member. When the deformable elastic member is in contact with the semiconductor wafer depression of the lever member creates, a temporary vacuum attachment is created between the deformable elastic membrane and the semiconductor wafer, permitting the semiconductor wafer to be safely lifted and transported.

24 Claims, 2 Drawing Sheets

4,892,343

VACUUM PENCIL

FIELD OF THE INVENTION

This invention relates to devices to manually lift and transport semiconductor wafers.

DESCRIPTION OF THE PRIOR ART

Semiconductor manufacturers have a need to manually lift and individually transport thin, fragile semiconductor wafers such as silicon wafers over short distances, for instances, from a storage container to processing equipment. Tweezers are often used for this purpose, although tweezers can scratch and damage the fragile surface of such wafers. Sophisticated vacuum wands are also in use; such vacuum wands must typically be connected to a central source of vacuum and include a form of trigger or valve for selectively coupling the vacuum to the tip of the tool. While such vacuum wands are less likely to scratch and damage the wafer, they are often difficult to use because the vacuum line connecting the wand to the central source of vacuum is often in the way of the user and restricts the user's mobility. Other devices to lift and move wafers have operated by means of a battery powered electric motor. However, these devices are unsatisfactory because the moving parts in the device are likely to generate particles which could contaminate the semiconductor wafers.

The general concept of handling smooth-surfaced work pieces by positioning a deformable rubber diaphragm adjacent the work surface, and creating a vacuum while pulling upwardly upon the center portion of the diaphragm while holding the peripheral portions of the diaphragm against the work surface, is well known in the art. For example, U.S. Pat. No. 2,341,621 to Johnson and French Patent No. 864,142 disclose nearly identical structures to one another. Both devices are used to lift and transfer sheet metal stock. A lever and spring mechanism is used together with a rubber pad to generate a vacuum and hence, lift the sheet metal. Other patents, such as U.S. Pat. Nos. 2,351,666 and 2,370,938 to Cohen, disclose devices used to lift and carry sheets of glass. However, both the devices used for lifting sheet metal stock, and for lifting heavy glass panels, would break fragile semiconductor wafers if an attempt were made to lift the wafers by means of the prior art devices. Moreover, the physical bulk of the prior art devices would prevent such devices from being inserted between adjacent wafers within a wafer cassette, wherein the distance of separation between wafers is approximately 0.180 inches.

U.S. Pat. Nos. 3,645,576 and 3,781,050 to Horres disclose devices for manipulating contact lenses. These devices include suction cups for removing a contact lens from the eye; however, the suction cups are conventional in nature and do not use either a lever or stem to create the vacuum. Furthermore, it is unlikely that such devices are thin enough to be inserted between wafers standing upright in a wafer cassette.

SUMMARY OF THE INVENTION

The present invention incorporates a vacuum pencil for transporting semiconductor wafers which includes a relatively flat, planar frame member having an enlarged end with a circular hole formed therein. A handle is coupled to the other end of the flat frame member. A relatively flat, deformable elastic member is adjacent and connected to the enlarged end of the flat frame member and concentric with the hole formed therein. The lever member having a relatively flat first end lies closely adjacent tot he flat frame member. The flat first end is connected to the center of the deformable elastic member, and an opposing second end is adapted to be depressed by the user, thereby causing the flat first end to pull up the center of the deformable elastic member; when the deformable elastic member is in contact with the semiconductor wafer, a temporary vacuum attachment is created, permitting the semiconductor wafer to be safely lifted and transported.

It is a primary object of the present invention to provide a non-destructive means for lifting and transport of fragile, thin semiconductor wafers.

It is a further object of the present invention to provide a thin, easily manipulated means for lifting semiconductor wafers from close, upright stance in a wafer cassette.

It is a still further object of the present invention to provide an uncomplicated and inexpensive means to lift and transport semiconductor wafers, which will not have a potential to contaminate the semiconductor wafers with particles or debris.

Other objects, advantages and features of the present invention will become apparent from the following specification when taken in conjunction with the accompanying drawings.

DESCRIPTION OF THE PREFERRED EMBODIMENT

Figure 1:
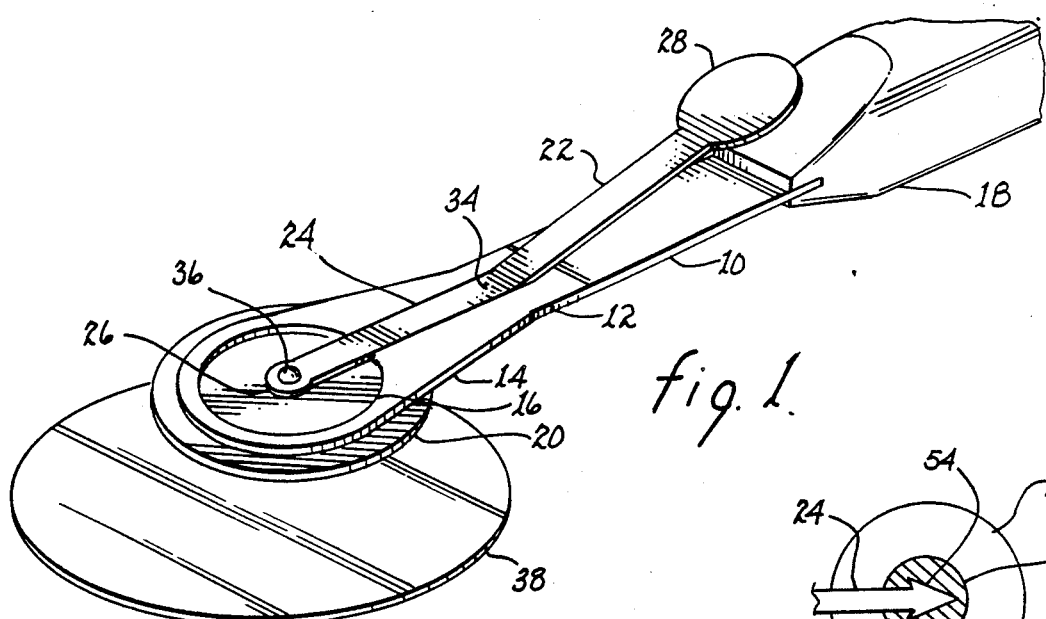
FIG. 1 is a perspective view of one embodiment of the vacuum pencil of the present invention.

FIG. 1 illustrates a first preferred embodiment of the vacuum pencil according to the present invention. Referring to FIG. 1, the vacuum pencil 10 includes a relatively flat, planar frame member 12 having an enlarged arcuately curved end 14 with a circular hole 16 formed therein. A handle 18 is coupled to the other end of the flat frame member 12 opposite end 14. A relatively flat, deformable elastic member 20 is provided, preferably made of silicone rubber, which is adjacent and connected to the enlarged end 14 of the flat frame member 12, and concentric with the hole 16 formed therein. Also included is a lever member 22 having a relatively flat first end 24 lying closely adjacent to the flat frame member 12. The flat first end 24 can be connected to the center 26 of the deformable elastic member 20 by the conventional method of gluing, or by engaging a connecting nipple 36, or by other means to be discussed later. The lever member 22 has an enlarged opposing second end 28 which is adapted to be depressed by the user's finger while the user is grasping handle 18. When the opposing end 28 is so depressed, the flat first end 24 raises the center 26 of the deformable elastic member 20. When the deformable elastic member 20 is in contact with a semiconductor member, a temporary vacuum attachment is created, permitting the fragile semiconductor member to be safely lifted and transported.

Instead of permanently connecting the flat first end 24 of lever member 22 to the center 26 of the deformable elastic member 20, a removable attachment may be provided by including as part of the deformable elastic member 20 a slightly raised portion 30 on the top center of deformable elastic member 20. The raised central portion 30 should have a shape and size so as to snugly engage the hole 16 formed in the enlarged end 14 of the flat frame member 12. In FIG. 1, the raised central portion 30 is essentially circular; the peripheral edge 32 of raised central portion 30 is disposed within and engaged by the inner walls of enlarged end 14 defining circular hole 16. Preferably, the diameter of the raised central portion 30 should be approximately two-thirds of the diameter of the deformable elastic member 20. The hole 16 is preferably slightly smaller than the outside diameter of the raised central portion 30, so that when the raised central portion 30 is pressed into the hole 16, the compliance and compressibility of the raised central portion 30 allow the slightly larger raised central portion 30 to snugly fit within the hole 16, and hence within the enlarged end 14 of the flat frame member 12. The snug fit results in the raised central portion 30 having a slight convexity above hole 16, which ultimately guarantees a good seal of the deformable elastic member 20 on the semiconductor wafer.

The fit between the raised central portion 30 and the hole 16 is critical, because if the fit is too tight, the deformable elastic membrane 20 distorts and a good seal cannot be accomplished with the surface of the semiconductor member. If the fit is too loose, it will not be possible to provide the proper convex shape of the raised central portion 30 in the hole 16, which is crucial for a proper seal to be maintained when the vacuum pencil is engaged with a semiconductor wafer.

If desired, means can be provided to connect the lever member 22 to the flat frame member 12. FIG. 1 illustrates pivot pin 34, which attaches the central portion of lever member 22 to the flat frame member 12.

Figure 2:
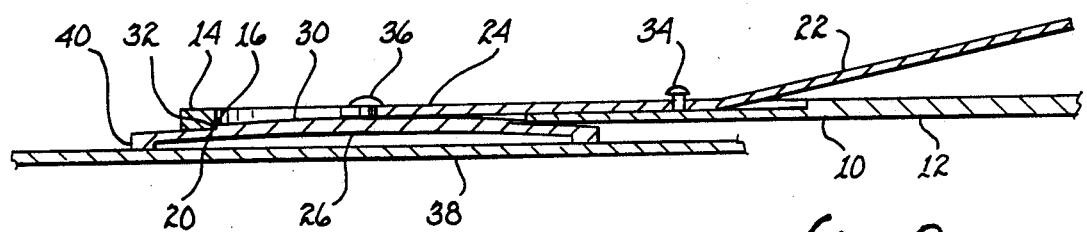
FIG. 2 is a closeup cross-sectional view of the vacuum pencil of FIG. 1.

FIG. 2 presents the embodiment of FIG. 1 in a cross-sectional view. The vacuum pencil 10 is shown placed on the rear face of a semiconductor wafer 38, with the deformable elastic member 20 closest to the wafer 38. The deformable elastic member 20 can also include a slightly downturned annular lip 40 formed along the periphery of the underside thereof. The purpose of annular lip 40 is to create a tight-fitting seal ring on the surface of the semiconductor wafer 38 when the deformable elastic member 20 is pressed against it and the vacuum pencil is being operated to move or lift semiconductor wafer 38.

Figure 3:
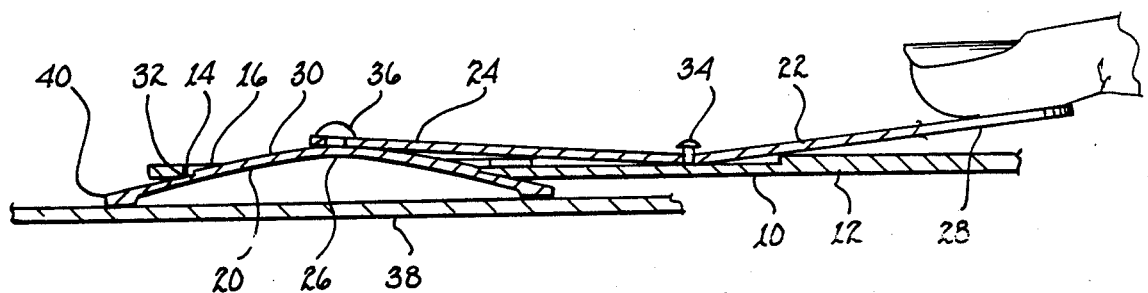
FIG. 3 is a closeup cross-sectional view of the vacuum pencil shown in FIGS. 1 and 2, in operation.

FIG. 3 illustrates the vacuum pencil 10 of FIGS. 1 and 2 in operation. When the annular lip 40 of the deformable elastic member 20 is placed on semiconductor wafer 38, finger pressure is applied to opposing second end 28 of lever member 22, causing by lever action the flat first end 24 to lift connecting nipple 36 and hence, lift up the center 26 of the deformable elastic member 20, creating a temporary vacuum attachment of the deformable elastic member to the semiconductor member 38. Once the proper vacuum attachment is created, the fragile, thin semiconductor member 38 can be safely lifted and transported as desired.

Figure 4:
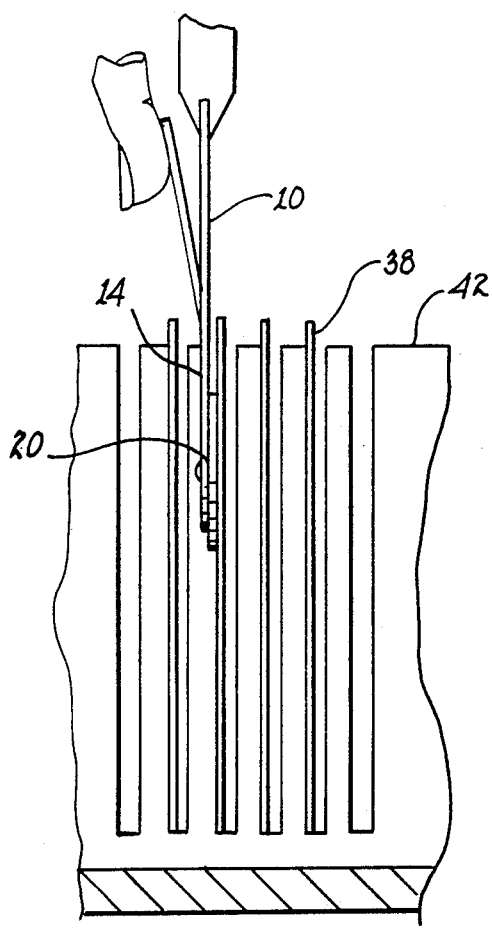
FIG. 4 is a perspective view of the vacuum pencil of the present invention in operation when inserted between semiconductor wafers standing in a wafer cassette.

FIG. 4 illustrates one of the unique benefits of a vacuum pencil constructed according to the teachings of the present invention. As shown in FIG. 4, semiconductor wafers 38 are commonly stored upright in a wafer cassette 42. In such a cassette, there is generally no greater than 0.180 inch separation between wafers. The vacuum pencil 10 can easily fit between the close-fitting semiconductor wafers 38, because the enlarged end 14 of the flat frame member 12, together with the adjacent deformable elastic member 20, when raised in operating position by action of the lever member 22, collectively have a thickness of less than 0.18 inch.

Figure 5:
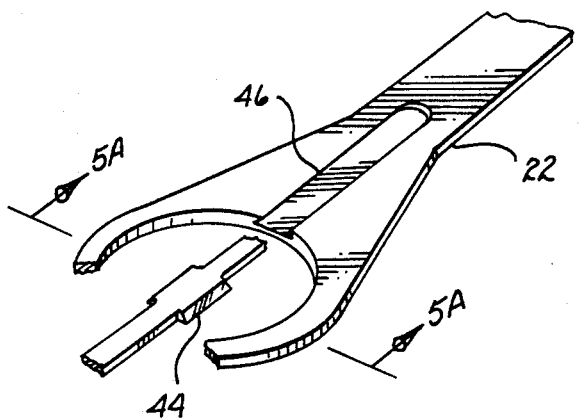
FIG. 5 is a perspective view of a second embodiment of a vacuum pencil.
Figure 5A:
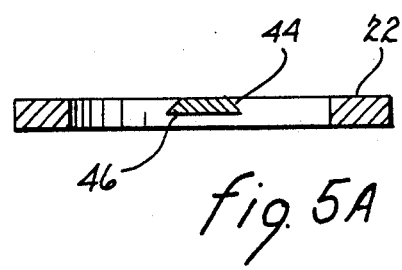
FIG. 5A is a sectional view taken on line 5A—5A of FIG. 5.

As discussed above, FIGS. 1 through 3 illustrate the attachment of the lever member 22 to the flat frame member 12 by means of a pivot pin 34. However, other methods can be used to make such an attachment. For example, FIG. 5 illustrates a second embodiment of the present invention wherein the central portion of lever member 22 includes at least one dovetail connector 44. The flat frame member 12 has a dovetail channel 46 formed therein and shaped to receive the dovetail connector 44. When the lever member 22 slides into dovetail channel 46, the dovetail connectors 44 loosely engage the dovetail channel 46, thereby attaching lever member 22 to the flat frame member 12, while permitting lever member 22 to pivot thereupon. FIG. 5A illustrates a sectional view taken along line 5A—5A of FIG. 5, showing dovetail connector 44 slidingly received within dovetail channel 46.

Figure 8A:
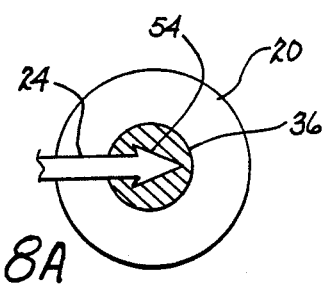
FIG. 8A is a top plan view taken on line 8A—8A of FIG. 8.
Figure 8:
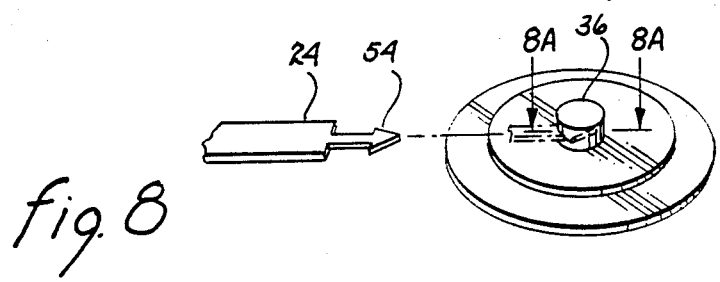
Figure 6:
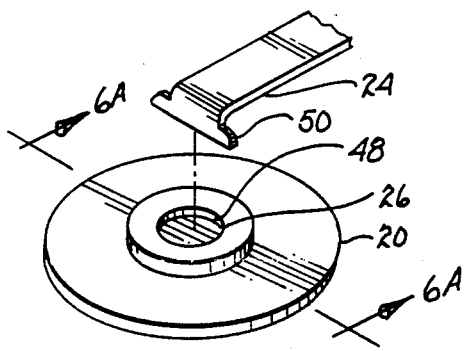
FIG. 6 is a perspective view of a third embodiment of the vacuum pencil of the present invention.
Figure 7:
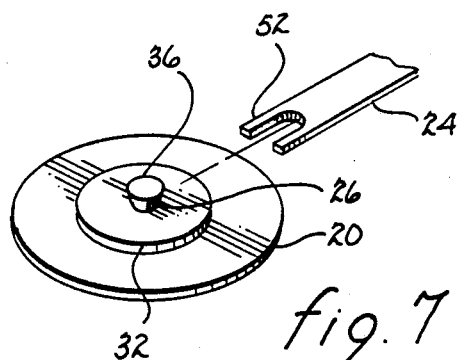
FIG. 7 is a perspective view of a fourth embodiment of the vacuum pencil of the present invention.
Figure 6A:
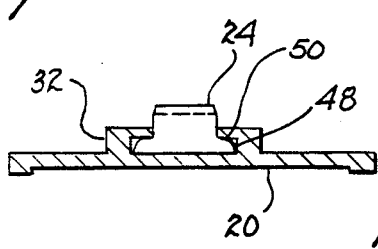
FIG. 6A is a sectional view taken on line 6A—6A of FIG. 6.

Remaining FIGS. 6–8 illustrate different means by which the flat first end 24 of the lever member 22 can be attached to the center 26 of the deformable elastic member 20. Referring to the third embodiment shown in FIG. 6, the center 26 of the deformable elastic member 20 includes a pocket 48 on top. The relatively flat first end 24 of lever member 22 has a shaped end 50, such as a downturned flare, corresponding to the shape of pocket 48, so that shaped end 50 will fit snugly into the pocket 48, thereby connecting the flat first end 24 to the deformable elastic member 20. FIG. 6A illustrates a sectional view taken along line 6A—6A of FIG. 6, showing shaped end 50 of the flat first end 24, inserted into pocket 48 of deformable elastic member 20.

FIG. 7 illustrates a fourth embodiment, wherein deformable elastic member 20 includes a nipple 36 extending upwardly and outwardly from the center 26. First end 24 of lever member 22 is formed as a fork 52 sized to closely clip substantially around raised nipple 36, thereby connecting the flat first end 24 to the deformable elastic member 20.

FIG. 8 illustrates a fifth embodiment wherein the flat first end 24 is formed as a pointed arrow shape 54 which can snugly embed itself in upwardly extending nipple 36. FIG. 8A illustrates a top plan view taken along line 8A—8A of FIG. 8, showing the pointed arrow shape 54 embedded in nipple 36 so as to provide an attachment of the flat first end 24 to the deformable elastic member 20.

Many materials can be used to construct the vacuum pencil of the present invention. Preferably, the deformable elastic member is made from silicone rubber, and the flat frame member and lever member are made from stainless steel. The handle is preferably made from a plastic material such as Delrin. However, the flat frame member and lever member can also be formed of a plastic material such as Delrin.

It is to be understood that the present invention is not limited to the particular construction and arrangement of parts disclosed and illustrated herein but embraces all such modified forms thereof which are within the scope of the following claims.

I claim:

1. A vacuum pencil for transporting semiconductor members, comprising:
   a. a relatively flat, planar frame member having an enlarged end with a substantially circular hole formed therein;
   b. a handle coupled to an end of the frame member opposite the enlarged end thereof;
   c. a relatively flat, deformable elastic member having a first upper side for engaging the enlarged end of the frame member and an opposing lower side for engaging a semiconductor member, the upper side of the deformable elastic member being disposed adjacent and connected to the enlarged end of the flat frame member and concentric with the hole formed therein, the deformable elastic member having a central portion;
   d. a lever member having a relatively flat first end lying closely adjacent to the flat frame member, the flat first end being connected to the central portion of the deformable elastic member, the lever member including an opposing second end adapted to be depressed by the user, thereby causing the flat first end to raise the central portion of the deformable elastic member to create a temporary vacuum attachment when the deformable elastic member is in contact with a semiconductor member, thereby permitting the semiconductor member to be safely lifted and transported.

2. The vacuum pencil as recited in claim 1, wherein the lower side of the deformable elastic member has a slight annular lip along the periphery thereof to create a seal ring on the surface of a semiconductor wafer when the deformable elastic member is pressed against it.

3. The vacuum pencil as recited in claim 1, further comprising connecting means to connect the lever member to the flat frame member.

4. The vacuum pencil as recited in claim 3, wherein said connecting means is pivot pin located approximately midway of the length of the lever member.

5. The vacuum pencil as recited in claim 3, wherein the lever member further comprises at least one dovetail connector extending from a central portion thereof, and wherein the flat frame member has a dovetail channel formed therein to slidingly receive the dovetail connector, thereby attaching the lever member to the flat frame member.

6. The vacuum pencil as recited in claim 3 wherein the enlarged end of the flat frame member together with the adjacent deformable elastic member, when raised by action of the lever member, collectively have a thickness no greater than 0.18 inches, thereby allowing the enlarged end and deformable elastic member to easily fit between semiconductor wafers standing upright in a wafer cassette.

7. The vacuum pencil as recited in claim 1, wherein the deformable elastic member is made from silicone rubber and wherein the flat frame member and lever member are made from stainless steel.

8. The vacuum pencil as recited in claim 1, wherein the deformable elastic member is made from silicone rubber and the flat frame member and lever member are made from a plastic material.

9. The vacuum pencil as recited in claim 8, wherein the plastic material is Delrin.

10. The vacuum pencil as recited in claim 1, wherein the upper side of the deformable elastic member has a pocket formed in the central portion thereof and wherein the relatively flat first end of the lever member is shaped to fit snugly into the pocket, thereby connecting the flat first end to the deformable elastic member.

11. The vacuum pencil as recited in claim 1, wherein the deformable elastic member further comprises a raised nipple extending from the upper side thereof and wherein the relatively flat first end of the lever member is shaped to closely engage the raised nipple, thereby connecting the flat first end to the deformable elastic member.

12. The vacuum pencil as recited in claim 11, wherein the relatively flat first end of the lever member has a forked shape to closely clip substantially around the raised nipple.

13. The vacuum pencil as recited in claim 11, wherein the relatively flat first end of the lever member has a pointed arrow shape to snugly embed itself in the nipple.

14. A vacuum pencil for transporting semiconductor members, comprising:
   a. a relatively flat, planar frame member having an enlarged end with a substantially circular hole formed therein;
   b. a handle coupled to an end of the frame member opposite the enlarged end thereof;
   c. a relatively flat, deformable elastic member having a first upper side for engaging the enlarged end of the frame member and an opposing lower side for engaging a semiconductor member, the upper side of the deformable elastic member being disposed adjacent to the enlarged end of the flat frame member and concentric with the hole formed therein, the deformable elastic member having a central portion;
   d. a lever member having a relatively flat first end lying closely adjacent to the flat frame member, the flat first end being connected to the central portion of the deformable elastic member, the lever member including an opposing second end adapted to be depressed by the user, thereby causing the flat first end to raise the central portion of the deformable elastic member to create a temporary vacuum attachment when the deformable elastic member is in contact with a semiconductor member, thereby permitting the semiconductor member to be safely lifted and transported.

15. The vacuum pencil as recited in claim 14, wherein the central portion of the deformable elastic member is slightly raised on the upper side thereof, the raised central portion having a shape and size so as to snugly engage the hole formed in the enlarged end of the flat frame member.

16. The vacuum pencil as recited in claim 15, wherein the deformable elastic member has a slight annular lip on the periphery of the lower side thereof to create a seal ring on the surface of a semiconductor wafer when the deformable elastic member is pressed against it.

17. The vacuum pencil as recited in claim 14, wherein the upper side of the deformable elastic member has a pocket formed in the central portion thereof and wherein the relatively flat first end of the lever member is shaped to fit snugly into the pocket, thereby connecting the flat first end to the deformable elastic member.

18. The vacuum pencil as recited in claim 14, wherein the deformable elastic member further comprises a raised nipple extending from the upper side thereof and wherein the relatively flat first end of the lever member is shaped to closely engage the raised nipple, thereby connecting the flat first end to the deformable elastic member.

19. The vacuum pencil as recited in claim 18, wherein the relatively flat first end of the lever member has a forked shape to closely clip substantially around the raised nipple.

20. The vacuum pencil as recited in claim 18, wherein the relatively flat first end of the lever member has a pointed arrow shape to snugly embed itself in the nipple.

21. The vacuum pencil as recited in claim 14 wherein the enlarged end of the flat frame member together with the adjacent deformable elastic member, when raised by action of the lever member, collectively have a thickness no greater than 0.18 inches, thereby allowing the enlarged end and deformable elastic member to easily fit between semiconductor wafers standing upright in a wafer cassette.

22. The vacuum pencil as recited in claim 14, wherein the deformable elastic member is made from silicone rubber and wherein the flat frame member and lever member are made from stainless steel.

23. The vacuum pencil as recited in claim 14, wherein the deformable elastic member is made from silicone rubber and the flat frame member and lever member are made from a plastic material.

24. The vacuum pencil as recited in claim 23, wherein the plastic material is Delrin.

* * * * *